(12) United States Patent
Tung (10) Patent No.: US 9,300,276 B2
(45) Date of Patent: Mar. 29, 2016

(54) OSCILLATION CONTROL CIRCUIT FOR BIASING RING OSCILLATOR BY BANDGAP REFERENCE SIGNAL AND RELATED METHOD

(71) Applicant: Elite Semiconductor Memory Technology Inc., Hsinchu (TW)

(72) Inventor: Ming-Sheng Tung, Hsinchu (TW)

(73) Assignee: Elite Semiconductor Memory Technology Inc., Science-Based Industrial Park, Hsinchu (TW)

( * ) Notice: Subject to any disclaimer, the term of this patent is extended or adjusted under 35 U.S.C. 154(b) by 262 days.

(21) Appl. No.: 13/736,085

(22) Filed: Jan. 8, 2013

(65) Prior Publication Data

US 2014/0191814 A1    Jul. 10, 2014

(51) Int. Cl.
| | |
|---|---|
| *H03K 3/03* | (2006.01) |
| *H03K 3/011* | (2006.01) |
| *H03B 5/04* | (2006.01) |
| *H03L 7/099* | (2006.01) |

(52) U.S. Cl.
CPC .............. *H03K 3/0315* (2013.01); *H03K 3/011* (2013.01); *H03B 5/04* (2013.01); *H03L 7/0995* (2013.01)

(58) Field of Classification Search
CPC .... H03K 3/0315; H03K 3/011; H03L 7/0995; H03B 5/04

USPC ...................... 331/57, 176; 327/539; 323/313
See application file for complete search history.

(56) References Cited

U.S. PATENT DOCUMENTS

| | | | | |
|---|---|---|---|---|
| 5,686,867 A | * | 11/1997 | Sutardja et al. ................. | 331/57 |
| 6,501,256 B1 | * | 12/2002 | Jaussi ...................... | G05F 3/30 |
| | | | | 323/315 |
| 6,803,831 B2 | * | 10/2004 | Nishikido ....................... | 331/57 |
| 6,809,603 B1 | * | 10/2004 | Ho .................................. | 331/57 |
| 6,856,566 B2 | * | 2/2005 | Takahashi et al. ............ | 365/222 |
| 6,901,022 B2 | * | 5/2005 | Fiscus .......................... | 365/222 |
| 7,199,646 B1 | * | 4/2007 | Zupcau et al. ................ | 327/539 |
| 7,391,274 B2 | * | 6/2008 | Hsu ................................ | 331/57 |
| 7,777,555 B2 | * | 8/2010 | Liao et al. .................... | 327/513 |
| 2003/0076180 A1 | * | 4/2003 | Murakami ..................... | 331/57 |
| 2011/0127987 A1 | * | 6/2011 | Harvey ......................... | 323/313 |
| 2011/0248172 A1 | * | 10/2011 | Rueger et al. ................ | 250/340 |
| 2013/0057246 A1 | * | 3/2013 | Satoh et al. .................. | 323/313 |

* cited by examiner

*Primary Examiner* — Richard Tan
(74) *Attorney, Agent, or Firm* — Winston Hsu; Scott Margo (57) ABSTRACT

An oscillation control circuit for a ring oscillator includes a bandgap reference circuit and an oscillation frequency control circuit. The bandgap reference circuit is arranged for generating a bandgap reference signal by mirroring a proportional-to-absolute-temperature current. The oscillation frequency control circuit is coupled to the bandgap reference circuit, and is arranged for biasing the ring oscillator according to the bandgap reference signal. When the ring oscillator has a plurality of stages, the oscillation frequency control circuit includes one current source and a plurality of current mirrors for biasing the plurality of stages of the ring oscillator, respectively.

4 Claims, 6 Drawing Sheets

OSCILLATION CONTROL CIRCUIT FOR BIASING RING OSCILLATOR BY BANDGAP REFERENCE SIGNAL AND RELATED METHOD

BACKGROUND OF THE INVENTION

1. Field of the Invention

The disclosed embodiments of the present invention relate to controlling oscillation of a ring oscillator, and more particularly, to an oscillation control circuit for biasing the ring oscillator utilizing a bandgap reference signal, and a control method thereof.

2. Description of the Prior Art

A ring oscillator is used as an intrinsic clock generation source, or as one stage within a more complex system such as a voltage controlled oscillator (VCO) or a phase locked loop (PLL), and may be used to issue a refresh command for a memory device, such as a dynamic random access memory (DRAM) device.

Figure 1:
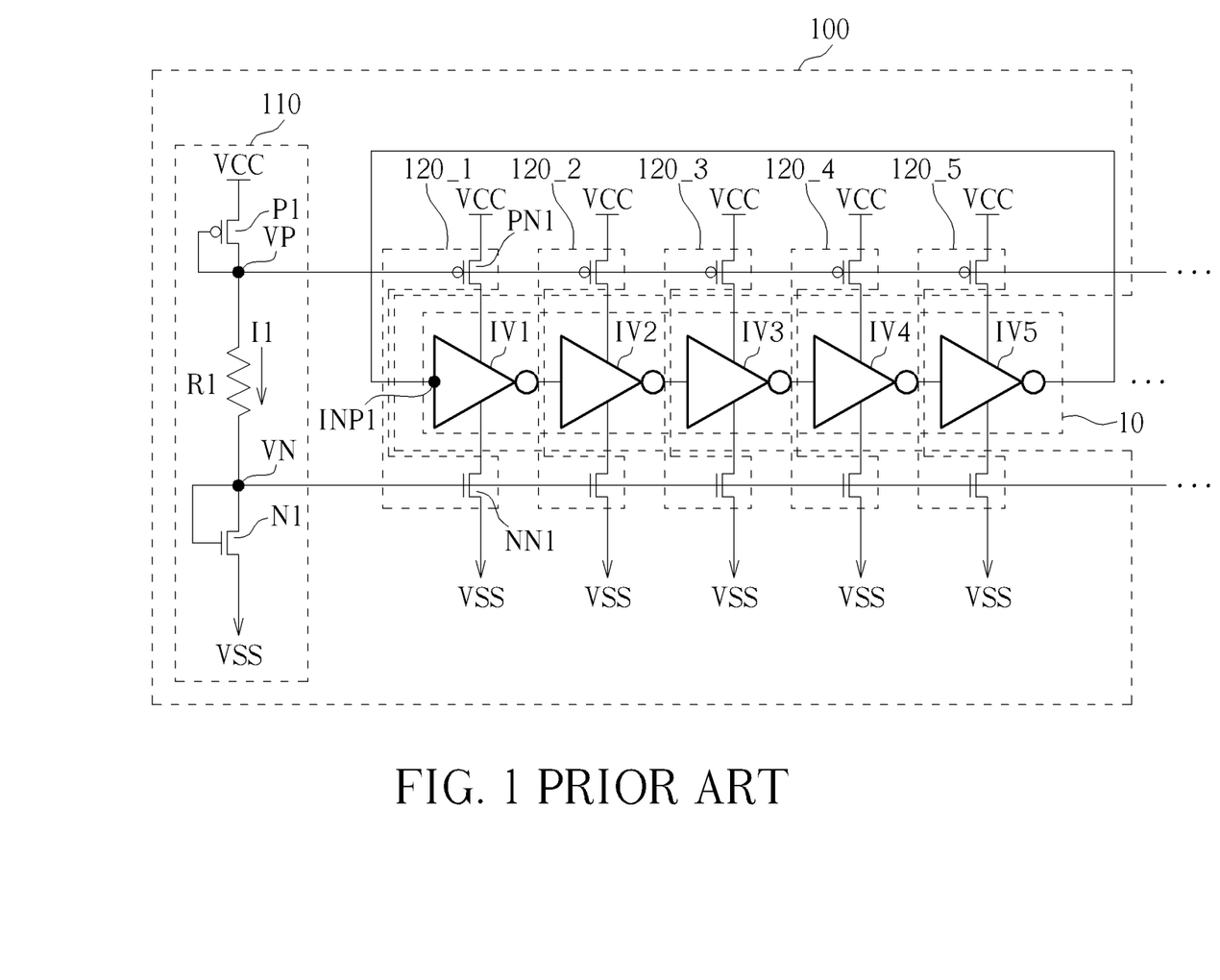
FIG. 1 is a schematic diagram illustrating an exemplary example of a traditional control circuit for a ring oscillator.

Please refer to FIG. 1, which is a schematic diagram illustrating an exemplary example of a traditional control circuit 100 for a ring oscillator 10. The ring oscillator 10 includes a plurality of inverters IN1-IN5, each having an input terminal and an output terminal coupled in series. The last inverter (i.e. the inverter IN5)'s output terminal OUT5 is coupled back to the first inverter (i.e. the inverter IN1)'s input terminal INP1. The ring oscillator 10 is controlled by the control circuit 100 including a current source 110 and a plurality of current mirrors 120_1~120_5. The current source 110 includes a p-channel metal-oxide-semiconductor field-effect transistor (MOSFET) P1, a resister R1 and an n-channel transistor N1 coupled in series as shown in FIG. 1, where a gate of the transistor P1 is coupled to a drain of the transistor P1, and a drain of the transistor N1 is coupled to a gate of the transistor N1. The resister R1 is coupled between the drain of the transistor P1 and the drain of the transistor N1. The current source 110 is powered by a voltage difference between a first operating voltage (e.g. a supply voltage) VCC and a second operating voltage (e.g. a ground voltage) VSS. Each of the plurality of current mirrors 120_1~120_5 includes a p-channel transistor and an n-channel transistor. For example, the current mirror 120_1 includes a p-channel transistor PN1 and an n-channel transistor NN1. A gate of the transistor P1 is coupled to the gate of the transistor P1, a drain of the transistor PN1 is coupled to the inverter IN1, and a source of the transistor P1 is coupled to the first operating voltage VCC. Similarly, a gate of the transistor NN1 is coupled to the gate of the transistor N1, a drain of the transistor NN1 is coupled to the inverter IN1, and a source of the transistor N1 is coupled to the second operating voltage VSS. The current mirrors 120_1-120_5 are configured in the same fashion. Assuming a voltage value at the drain of the transistor P1 is VP and a voltage value at the drain of the transistor N1 is VN, a current I1 provided by the current source 110 will be (VP−VN)/R1.

As most semiconductor technology fabrications advance from 0.18 microns to a 0.13 microns manufacturing process, the typical operating voltages used to control the transistors to be turned on or off are reduced from 2.5 volts to 1.8 volts. The resulting circuit becomes more sensitive to manufacture and temperature variations. That is, when the first operating voltage VCC drops down, the voltage difference (VP−VN) becomes very small.

If a threshold voltage of a p-channel transistor is lower than normal, the p-channel transistor will have a higher speed. Similarly, if a threshold voltage of an n-channel transistor is higher than normal, the n-channel transistor will have a higher speed. Thus a delay time of the conventional ring oscillator 10 varies according to different temperatures and manufacturing process parameters, even under a condition that the parameters are within set specifications and the operating voltage VCC is regulated.

SUMMARY OF THE INVENTION

In accordance with exemplary embodiments of the present invention, an oscillation control circuit for biasing the ring oscillator utilizing a bandgap reference signal and a related control method are proposed to solve the above-mentioned problem.

According to a first aspect of the present invention, an exemplary oscillation control circuit for a ring oscillator is disclosed. The exemplary oscillation control circuit includes a bandgap reference circuit and an oscillation frequency control circuit. The bandgap reference circuit is arranged for generating a bandgap reference signal by mirroring a proportional-to-absolute-temperature current. The oscillation frequency control circuit is coupled to the bandgap reference circuit, and is arranged for biasing the ring oscillator according to the bandgap reference signal.

According to a second aspect of the present invention, an exemplary oscillation control method for a ring oscillator is disclosed. The exemplary oscillation control method includes generating a bandgap reference signal by mirroring a proportional-to-absolute-temperature current; and biasing the ring oscillator according to the bandgap reference signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 2A:
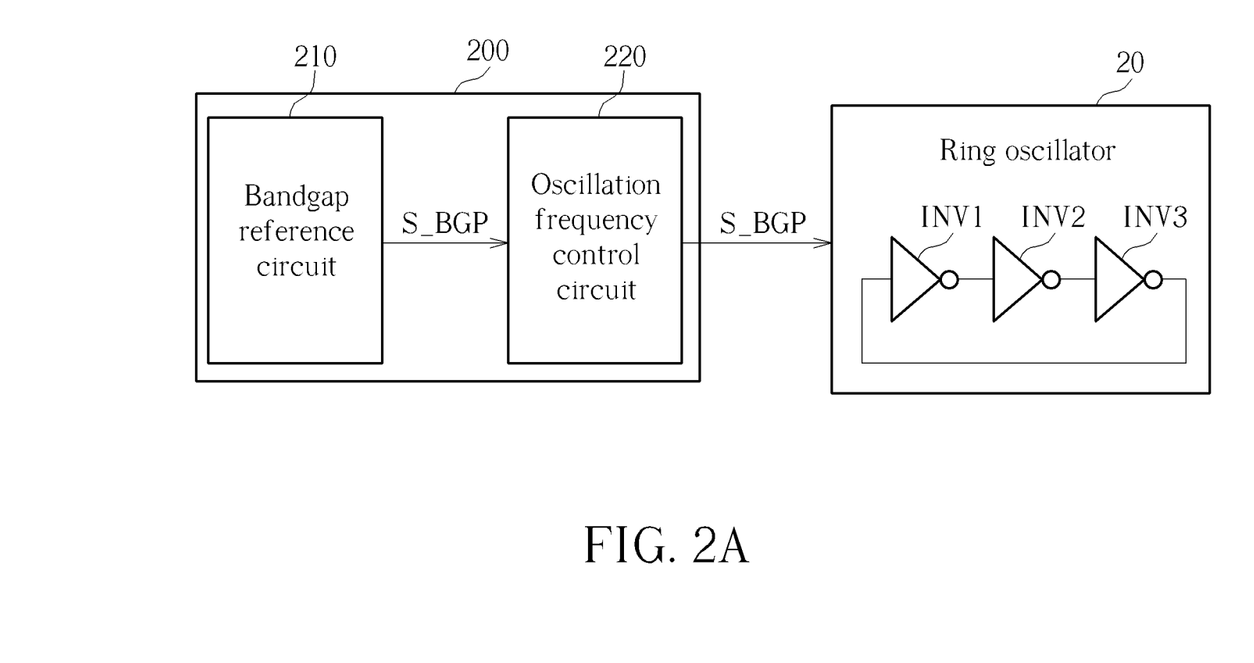
FIG. 2A is a block diagram illustrating a control circuit for a ring oscillator according to an embodiment of the present invention.

Please refer to FIG. 2A, which is a block diagram illustrating a control circuit 200 for a ring oscillator 20 according to an embodiment of the present invention. The ring oscillator 20 may have a plurality of stages. For example, the ring oscillator 20 may include a plurality of inverters INV1-INV3, each having an input terminal and an output terminal coupled in series, and the last inverter (i.e. the inverter INV3)'s output terminal is coupled back to the first inverter (i.e. the inverter INV1)'s input terminal. Each stage of the ring oscillator 20 is independently controlled/biased by the control circuit 200. The control circuit 200 includes, but is not limited to, a bandgap reference circuit 210 and an oscillation frequency control circuit 220. The bandgap reference circuit 210 is arranged for generating a bandgap reference signal S_BGP, and the oscillation frequency control circuit 220 is coupled to the bandgap reference circuit 210 and arranged for biasing the ring oscillator 20 according to the bandgap reference signal S_BGP.

Figure 2B:
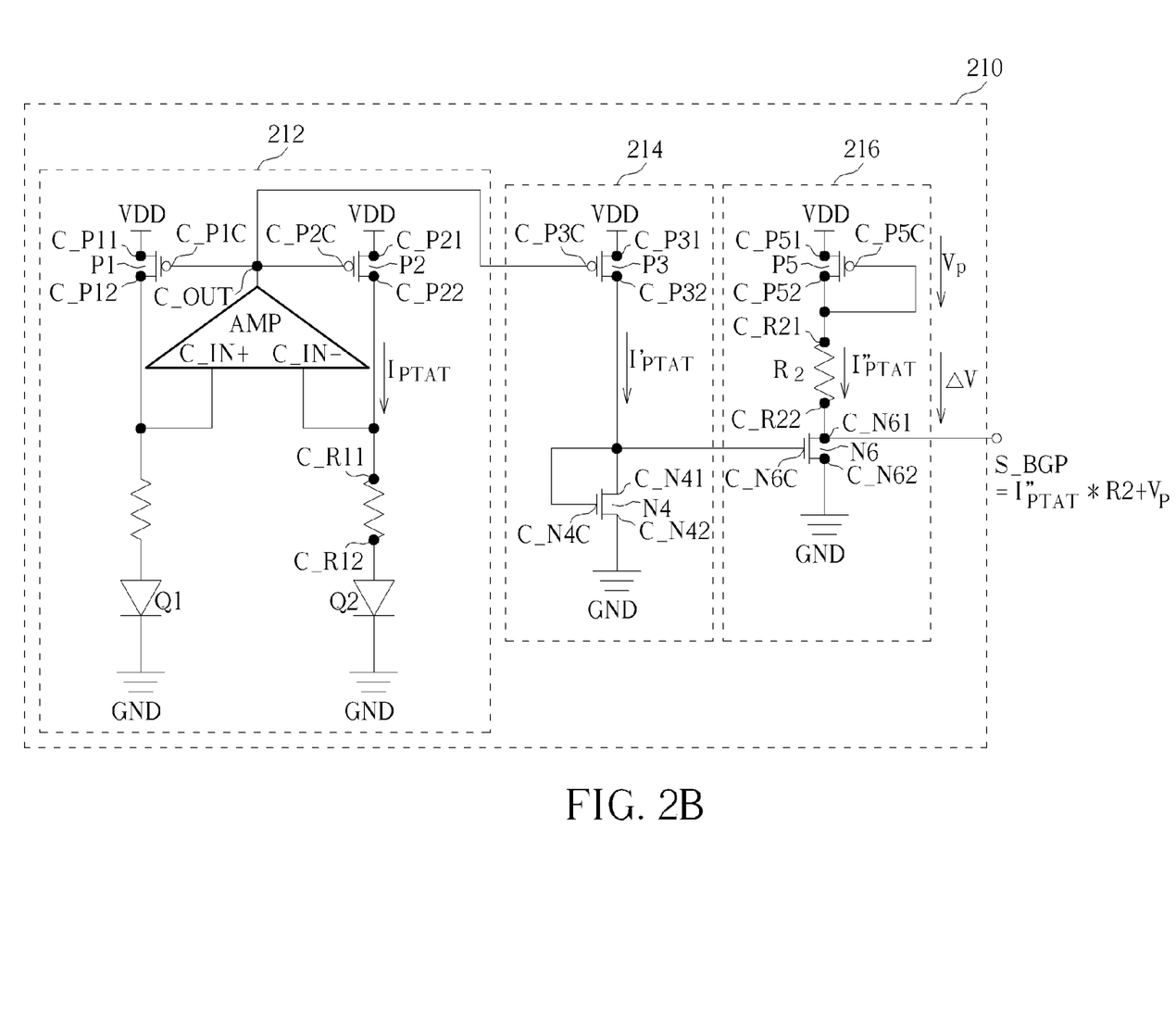
FIG. 2B is a circuit diagram illustrating the bandgap reference circuit shown in FIG. 2A according to an embodiment of the present invention.

Please refer to FIG. 2B, which is a circuit diagram illustrating the bandgap reference circuit 210 shown in FIG. 2A according to an embodiment of the present invention. The bandgap reference circuit 210 includes, but is not limited to, a first circuit 212, a second circuit 214, and a third circuit 216. The first circuit 212 includes, but is not limited to, a differential amplifier AMP, a transistor (e.g. a p-channel transistor) P1, a transistor (e.g. a p-channel transistor) P2, a resistor R1, a diode D1 and a diode D2. The differential amplifier AMP has a positive input node C_IN+, a negative input node C_IN−, and an output node C_OUT. The transistor P1 has a first connection node C_P11 coupled to a first reference voltage (e.g. a supply voltage VDD), a second connection node C_P12 coupled to the positive input node C_IN+ of the differential amplifier AMP, and a control node C_P1C coupled to the output node C_OUT of the differential amplifier AMP. The transistor P2 has a first connection node C_P21 coupled to the first reference voltage, a second connection node C_P22 coupled to the negative input node C_IN− of the differential amplifier AMP, and a control node C_P2C coupled to the output node C_OUT of the differential amplifier AMP. The resistor R1 has a first end C_R11 and a second end C_R12, where the first end C_R11 is coupled to the negative input node C_IN− of the differential amplifier AMP, and a second end C_R12. The diode D1 has an anode coupled to the positive input node C_IN+ of the differential amplifier AMP and a cathode coupled to a second reference voltage (e.g., a ground voltage GND). The diode D2 has an anode coupled to the second end C_R12 of the resistor R1 and a cathode coupled to the second reference voltage.

Regarding the second circuit 214, it includes, but is not limited to, a transistor (e.g. a p-channel transistor) P3 and a transistor (e.g. an n-channel transistor) N4. The transistor P3 has a first connection node C_P31 coupled to the first reference voltage, a second connection node C_P32, and a control node C_P3C coupled to the output node C_OUT of the differential amplifier AMP. The transistor N4 has a first connection node C_N41 coupled to the second connection node C_P32 of the transistor P3, a second connection node C_N42 coupled to the second reference voltage, and a control node C_N4C coupled to the second connection node C_N42 of the transistor N4.

Regarding the third circuit 216, it includes, but is not limited to, a transistor (e.g. a p-channel transistor) P5, a resistor R2, and a transistor (e.g. an n-channel transistor) N6. The transistor P5 has a first connection node C_P51 coupled to the first reference voltage, a second connection node C_P52 and a control node C_P5C coupled to the second connection node C_P52. The resistor R2 has a first end C_R21 coupled to the second connection node C_P52 of the transistor P5, and a second end C_R22. The transistor N6 has a first connection node C_N61 coupled to the second end C_R22 of the resistor R2, a second connection node CN62 coupled to the second reference voltage, and a control node C_N6C coupled to the first connection node C_N41 of the transistor N4.

In this embodiment, the first circuit 212 is utilized for generating a first current $I_{PTAT}$ which is proportional to absolute temperature. The second circuit 214 is utilized for generating a second current $I'_{PTAT}$ by mirroring the first current $I_{PTAT}$. The generated second current $I'_{PTAT}$ should have characteristics similar or identical to those possessed by the first current $I_{PTAT}$. For example, the second current $I'_{PTAT}$ is also proportional to absolute temperature. The third circuit 216 is utilized for generating a third current $I''_{PTAT}$ by mirroring the second current $I'_{PTAT}$ and accordingly generating the bandgap reference signal S_BGP. The generated third current $I''_{PTAT}$ should have characteristics similar or identical to those possessed by the second current $I'_{PTAT}$. For example, the third current $I''_{PTAT}$ is also proportional to absolute temperature.

In this embodiment, the bandgap reference signal S_BGP is generated by combining a proportional-to-absolute-temperature signal branch and a complementary-to-absolute-temperature signal branch. The proportional-to-absolute-temperature signal branch is constituted by a voltage drop $\Delta V$ between the first end C_R21 of the second resister R2 and the second end C_R22 of the second resister R2. The voltage drop $\Delta V$ results from the third current $I'_{PTAT}$ flowing through the second resister R2, and hence can be expressed as $\Delta V = I''_{PTAT} \times R2$. Since the third current $I''_{PTAT}$ is proportional to absolute temperature, the voltage drop $\Delta V$ is also proportional to absolute temperature. In addition, the complementary-to-absolute-temperature signal branch is constituted by a threshold voltage Vp of the transistor P5, which is complementary to absolute temperature. Therefore, the bandgap reference signal S_BGP is the total voltage difference between the first reference voltage and the first connection node C_N61 of the transistor N6, and can be expressed as $S\_BGP = I''_{PTAT} \times R2 + Vp$.

Figure 2C:
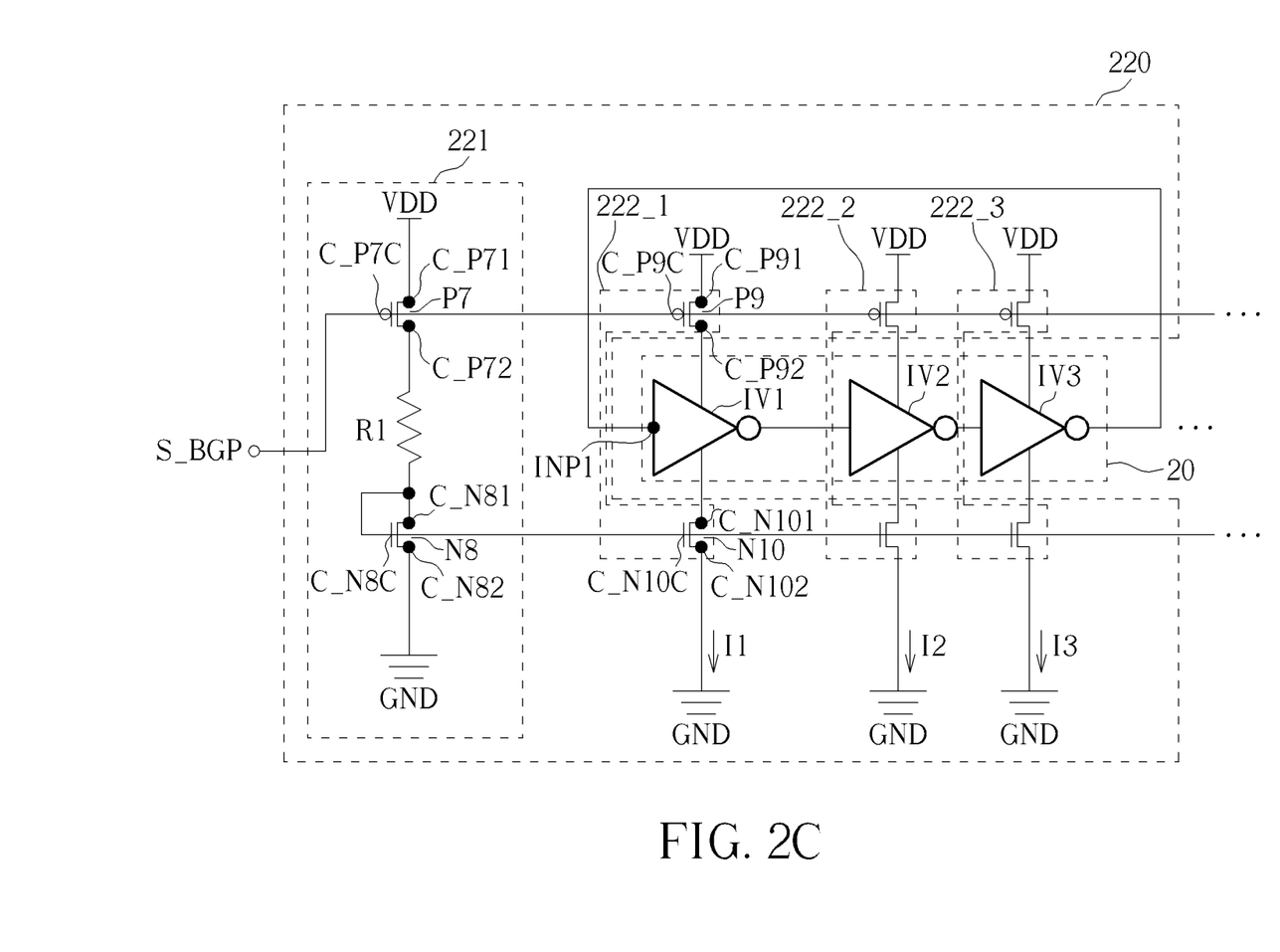
FIG. 2C is a circuit diagram illustrating the oscillation frequency control circuit shown in FIG. 2A according to a first embodiment of the present invention.

Please refer to FIG. 2C, which is a circuit diagram illustrating the oscillation frequency control circuit 220 shown in FIG. 2A according to a first embodiment of the present invention. The oscillation frequency control circuit 220 includes, but is not limited to, a current source 221 and a plurality of current mirrors 222_1-222_3. The current source 221 includes, but is not limited to, a transistor (e.g. a p-channel transistor) P7 and a transistor (e.g. an n-channel transistor) N8. The transistor P7 has a first connection node C_P71 coupled to the first reference voltage, a second connection node C_P72, and a control node C_P7C coupled to the first connection node C_N61 of the transistor N6. The transistor N8 has a first connection node C_N81, a second connection node C_N82 coupled to the second reference voltage, and a control node C_N8C coupled to the first connection node C_N81.

Since the structure of each of the plurality of current mirrors 222_1-222_3 is identical, the following description will take the current mirror 222_1 as an example for illustrative purposes, and descriptions regarding other current mirrors will be omitted for brevity. The current mirror 222_1 includes, but is not limited to, a transistor (e.g. a p-channel transistor) P9 and a transistor (e.g. an -n-channel transistor) N10. The transistor P9 has a first connection node C_P91 coupled to the first reference voltage, a second connection node C_P92 coupled to a corresponding stage of the ring oscillator 20, and a control node C_P9C coupled to the first connection node C_N61 of the transistor N6, i.e. the bandgap reference signal. The transistor N10 has a first connection node C_N101 coupled to the corresponding stage of the ring oscillator 20, a second connection node C_N102 coupled to the second reference voltage, and a control node C_N10C coupled to the control node C_N8C of the transistor N8. That is, the corresponding stage of the ring oscillator 20 is coupled to the second reference voltage via the transistor N10.

In this embodiment, the current source 221 is coupled to the bandgap reference circuit 210, and arranged for providing a current according to the bandgap reference signal S_BGP. The current mirrors 222_1-222_3 are coupled to the current source 221 and the ring oscillator 20, and arranged for generating a plurality of operating currents I1-I3 respectively corresponding to the plurality of stages of the ring oscillator 20 by mirroring the current provided by the current source 221. Please note that the above implementations are for illustrative purposes only, and are not meant to be limitations of the present invention.

Figure 3:
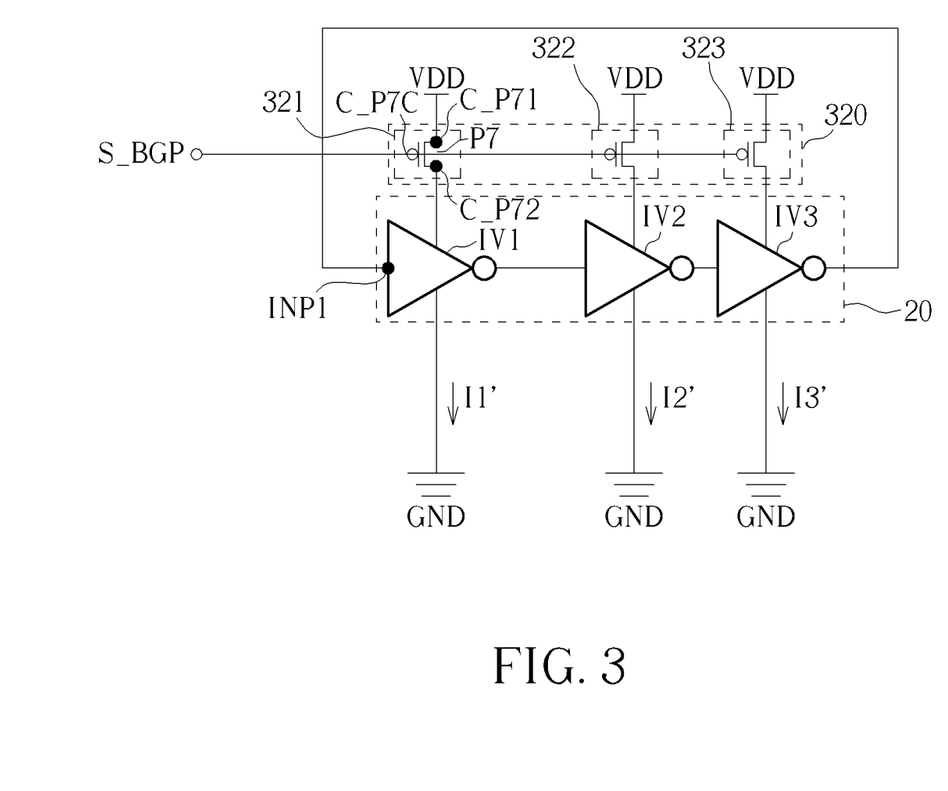
FIG. 3 is a circuit diagram illustrating the oscillation frequency control circuit according to a second embodiment of the present invention.

Please refer to FIG. 3, which is a circuit diagram illustrating the oscillation frequency control circuit 320 according to a second embodiment of the present invention. The oscillation frequency control circuit 320 includes, but is not limited to, a plurality of current sources 321-323. Since the structure of each of the plurality of current mirrors 321-323 is identical, the following description will take the current mirror 321 as an example for illustrative purposes, and descriptions regarding other current mirrors will be omitted for brevity. The current mirror 321 includes a transistor (e.g. a p-channel transistor) P7 has a first connection node C_P71 coupled to the first reference voltage, a second connection node C_P72 coupled to the corresponding stage of the ring oscillator 20, and a control node C_P7C coupled to the first connection node C_N61 of the transistor N6, i.e. the bandgap reference signal. Please note that the corresponding stage of the ring oscillator 20 should be coupled to the second reference voltage accordingly. In the embodiment, the current sources 321-323 are coupled to the stages of the ring oscillator 20, respectively. The current sources 321-323 are controlled by the bandgap reference signal S_BGP for generating a plurality of operating currents I1'-I3' to the stages of the ring oscillator 20 respectively.

Figure 4:
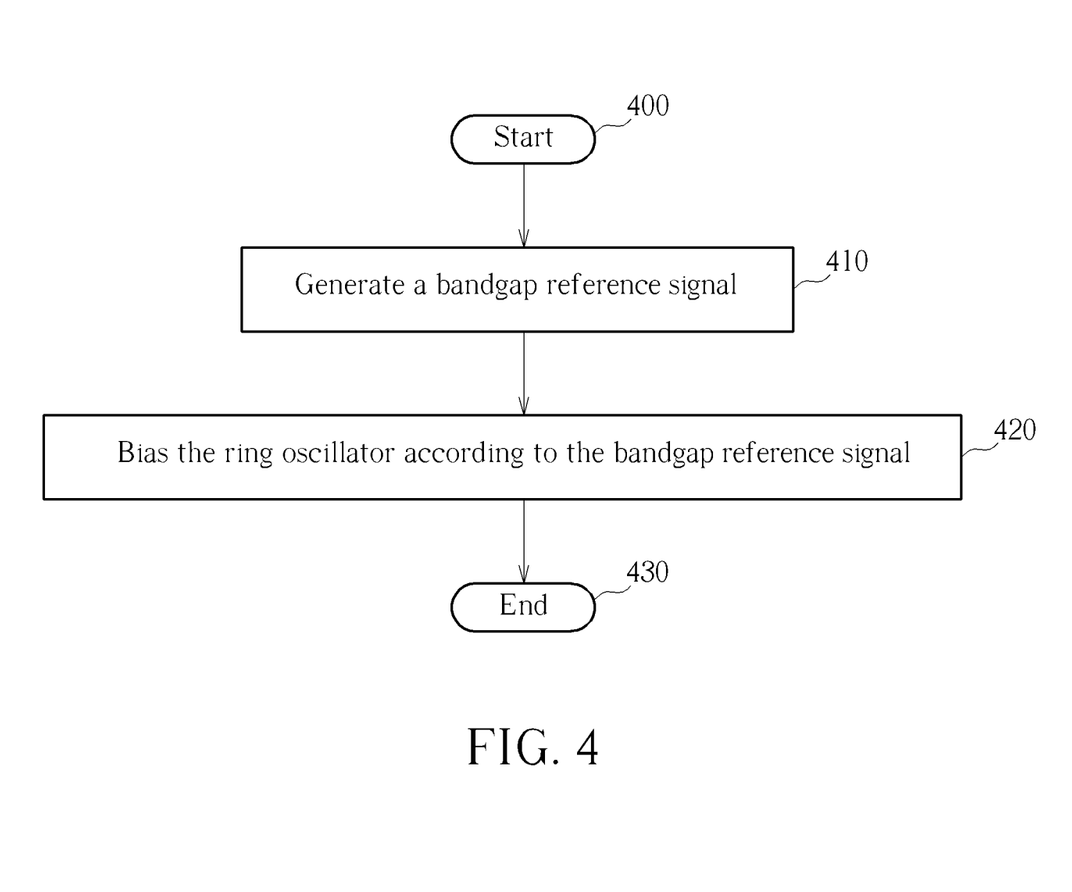
FIG. 4 is a flowchart illustrating an exemplary control method for a ring oscillator according to an embodiment of the present invention.

Please refer to FIG. 4, which is a flowchart illustrating an exemplary control method for a ring oscillator according to an embodiment of the present invention. The method includes (but is not limited to) the following steps. Please note that, if the result is substantially the same, the steps are not required to be executed in the exact order shown in FIG. 4.

Step 400: Start;
Step 410: Generate a bandgap reference signal by mirroring a proportional-to-absolute-temperature current;
Step 420: Bias the ring oscillator according to the bandgap reference signal;
Step 430: End Step 410 may be executed by the bandgap reference circuit 210, and step 420 may be executed by the oscillation frequency control circuit 220. As a person skilled in the art can readily understand operations of the steps shown in FIG. 4 after reading the above paragraphs, further description is omitted here for the sake of brevity.

In short, since the present invention can provide a bandgap reference to bias a ring oscillator, the ring oscillator will not suffer from manufacture variation and/or temperature variation. The provided bandgap reference can be easily scaled to accommodate to applications with a small operation voltage region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oscillation control circuit for a ring oscillator, comprising:
   a bandgap reference circuit, for generating a bandgap reference signal by mirroring a proportional-to-absolute-temperature current; and
   an oscillation frequency control circuit, coupled to the bandgap reference circuit, for biasing the ring oscillator according to the bandgap reference signal;
   wherein the bandgap reference circuit comprises:
   a first transistor, having a first connection node, a second connection node and a control node, the first connection node of the first transistor being coupled to a first reference voltage, the control node of the first transistor being coupled to a current source providing the proportional-to-absolute-temperature current and the first transistor mirrors the proportional-to-absolute-temperature current to generate a first current;
   a second transistor, having a first connection node, a second connection node and a control node, the first connection node of the second transistor being coupled to the second connection node of the first transistor, and the control node of the second transistor being coupled to the first connection node of the second transistor;
   a third transistor, having a first connection node, a second connection node and a control node, the first connection node of the third transistor being coupled to the first reference voltage, and the second connection node of the third transistor being coupled to the control node of the third transistor;
   a resistor, having a first end and a second end, the first end of the resistor being coupled to the second connection node of the third transistor; and
   a fourth transistor, having a first connection node, a second connection node and a control node, the first connection node of the fourth transistor being coupled to the second end of the resistor, the second connection node of the fourth transistor being coupled to a second reference voltage, and the control node of the fourth transistor being coupled to the control node of the second transistor to mirror the first current flowing through the second transistor to generate a second current, wherein the bandgap reference circuit generates the bandgap reference signal according to the second current, and the first transistor and the fourth transistor have conductive channels of different types.

2. The oscillation control circuit of claim 1, wherein the oscillation frequency control circuit comprises:
   a first transistor, having a first connection node, a second connection node and a control node, the first connection node of the first transistor being coupled to the first reference voltage, and the control node of the first transistor being coupled to the bandgap reference signal; and
   a second transistor, having a first connection node, a second connection node and a control node, the first connection node of the second transistor being coupled to the control node of the second transistor, and the second connection node of the second transistor being coupled to the second reference voltage.

3. The oscillation control circuit of claim 2, wherein the oscillation frequency control circuit further comprises at least one current mirror for biasing a corresponding stage of the ring oscillator, and the at least one current mirror comprises:
- a third transistor, having a first connection node, a second connection node and a control node, the first connection node of the third transistor being coupled to the first reference voltage, the second connection node of the third transistor being coupled to the corresponding stage of the ring oscillator, and the control node of the third transistor being coupled to the control node of the first transistor; and
- a fourth transistor, having a first connection node, a second connection node and a control node, the first connection node of the fourth transistor being coupled to the corresponding stage of the ring oscillator, the second connection node of the fourth transistor being coupled to the second reference voltage, and the control node of the fourth transistor being coupled to the control node of the second transistor.

4. The oscillation control circuit of claim 1, wherein the oscillation frequency control circuit comprises:
- a transistor, having a first connection node, a second connection node and a control node, the first connection node of the transistor being coupled to the first reference voltage, the second connection node of the transistor being coupled to a corresponding stage of the ring oscillator, and the control node of the transistor being coupled to the bandgap reference signal.

\* \* \* \* \*